(12) United States Patent
Fairbanks

(10) Patent No.: US 6,281,707 B1
(45) Date of Patent: Aug. 28, 2001

(54) TWO-STAGE MULLER C-ELEMENT

(75) Inventor: Scott M. Fairbanks, Mountain View, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/401,747

(22) Filed: Sep. 23, 1999

(51) Int. Cl.$^7$ .................. H03K 19/094; H03K 19/02
(52) U.S. Cl. ................................. 326/83; 326/58
(58) Field of Search .................. 326/121, 119, 326/112, 82, 83, 56–58

(56) References Cited

U.S. PATENT DOCUMENTS

| | | | |
|---|---|---|---|
| 4,697,107 | * 9/1987 | Haines | 307/474 |
| 5,081,374 | * 1/1992 | Davis | 307/451 |
| 5,239,214 | * 8/1993 | Segawa et al. | 307/473 |
| 6,114,884 | * 9/2000 | Kaplinsky | 327/108 |

* cited by examiner

*Primary Examiner*—Michael Tokar
*Assistant Examiner*—Daniel D. Chang
(74) *Attorney, Agent, or Firm*—Townsend and Townsend and Crew LLP

(57) ABSTRACT

A Muller C-element comprises two stages. The first stage consists of a NAND and a NOR gate, each driven by all of the inputs to the Muller C-element. In the second stage, the outputs of the two gates are used separately to switch on and off two output transistors, which drive the output of the Muller C-element A keeper flip flop serves to retain the output value between changes. Because current from each gate is applied only to one output transistor, delay is reduced. Furthermore, an unneeded output transistor is switched off as soon as logically possible, often during the otherwise unused interval while the input values differ, which reduces both delay and crossover current. In a preferred embodiment, the NAND and NOR gates each comprise a set of series transistors and a set of parallel transistors. The parallel transistors in these gates work together to change the output value when all inputs are changing simultaneously, thereby allowing the use of parallel transistors having widths narrower than those normally employed in NAND and NOR gates. Use of smaller transistors renders the inputs easier to drive, improving the speed of the circuit.

3 Claims, 7 Drawing Sheets

TWO-STAGE MULLER C-ELEMENT

BACKGROUND OF THE INVENTION

A Muller C-element is a standard component in an electronic circuit for detecting when the last of two or more events has occurred. In the simplest form of Muller C-element, the output becomes TRUE (logical high) when all the inputs are TRUE and remains TRUE until all of its inputs are FALSE (logical low).

A Muller C-element is often included in completion detectors for asynchronous systems. The speed of the Muller C-element is an important factor in the overall speed of such systems.

Examples of prior art Muller C elements are shown in FIG. 1 and FIG. 2. In FIG. 1, input A drives two transistors 120, 130. Input B drives a transistor 140 in series with transistor 130, and a transistor 110 in series with transistor 120. These two pairs of series transistors drive an output line 190. Back-to-back inverters 170, 180 serve as a "keeper" to retain the previous value of the output when neither set of series transistors is conducting, as is the case when one input is logical low while the other is logical high. Output line 140 drives a buffer amplifier comprising a first output transistor 150 and a second output transistor 160; this buffer amplifier produces output C.

In the Muller C-element of FIG. 2, there are two series stacks 200, 202. The first stack comprises P-type transistors 210, 220 and N-type transistors 230, 240; the second comprises P-type transistors 212, 222 and N-type transistors 232, 242. Each transistor has a gate connected to one of the two inputs A and B. In this circuit, the "keeper" function is obtained with reduced energy consumption by using central transistors 280, 282. When inputs A and B differ, one series stack or the other continues to provide a connection between the power supply or ground and the output 290. Output transistors 250 and 260 function as do their counterparts in FIG. 1.

The speed of these Muller C-elements is limited because current from the series transistors must be used both to switch on one output transistor and to switch off the other. Furthermore, output C can change only when the newly switched on output transistor begins to deliver more current than is absorbed by the transistor that is switching off. Typically, this occurs at about half the supply voltage. Moreover, during the time that both output transistors are conducting, some "crossover" current flows directly from the power supply to ground through the two output transistors, serving no useful purpose. This crossover current also introduces delay into the circuit.

It is therefore desirable to have a Muller C-element capable of running faster and with less wasted energy.

SUMMARY OF THE INVENTION

According to one aspect of the present invention, a Muller C-element comprises two stages. The first stage consists of a NAND and a NOR gate, each driven by all of the inputs to the Muller C-element. In the second stage, the outputs of the two gates are used separately to switch on and off two output transistors, which drive the output of the Muller C-element A keeper flip flop serves to retain the output value between changes. Because current from each gate is applied only to one output transistor, delay is reduced. Furthermore, an unneeded output transistor is switched off as soon as logically possible, often during the otherwise unused interval while the input values differ, which reduces both delay and crossover current.

According to another aspect of the invention, the NAND and NOR gates each comprise a set of series transistors and a set of parallel transistors which divide the tasks of switching on and switching off the output driver transistors. The series transistors are reserved for the critical function of turning on the output transistors. All other tasks, such as turning of the output driver transistors, are performed by the parallel transistors. Since the sum of the output currents of the parallel transistors is available to switch off the output driver transistors, the parallel transistors can be made narrower than would be usual in ordinary NAND and NOR gates. Such reduced size transistors present a smaller load at the input of the Muller C-element, making it easier to drive and thus resulting in overall higher speed operation.

Other features and advantages of the invention will be apparent in view of the following detailed description and appended drawings.

DESCRIPTION OF THE SPECIFIC EMBODIMENTS

Figure 1:
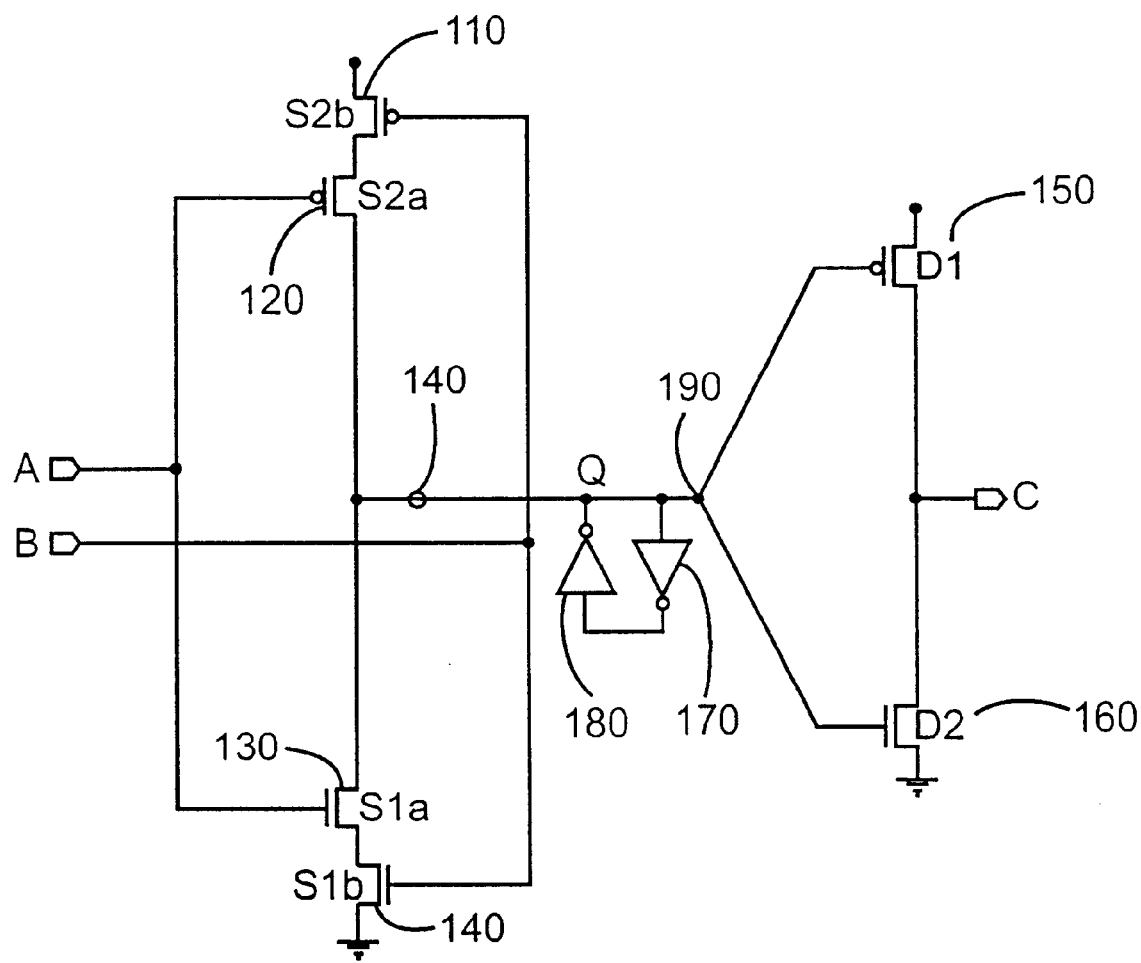
FIG. 1 is a prior art Muller C-element with two inputs.
Figure 2:
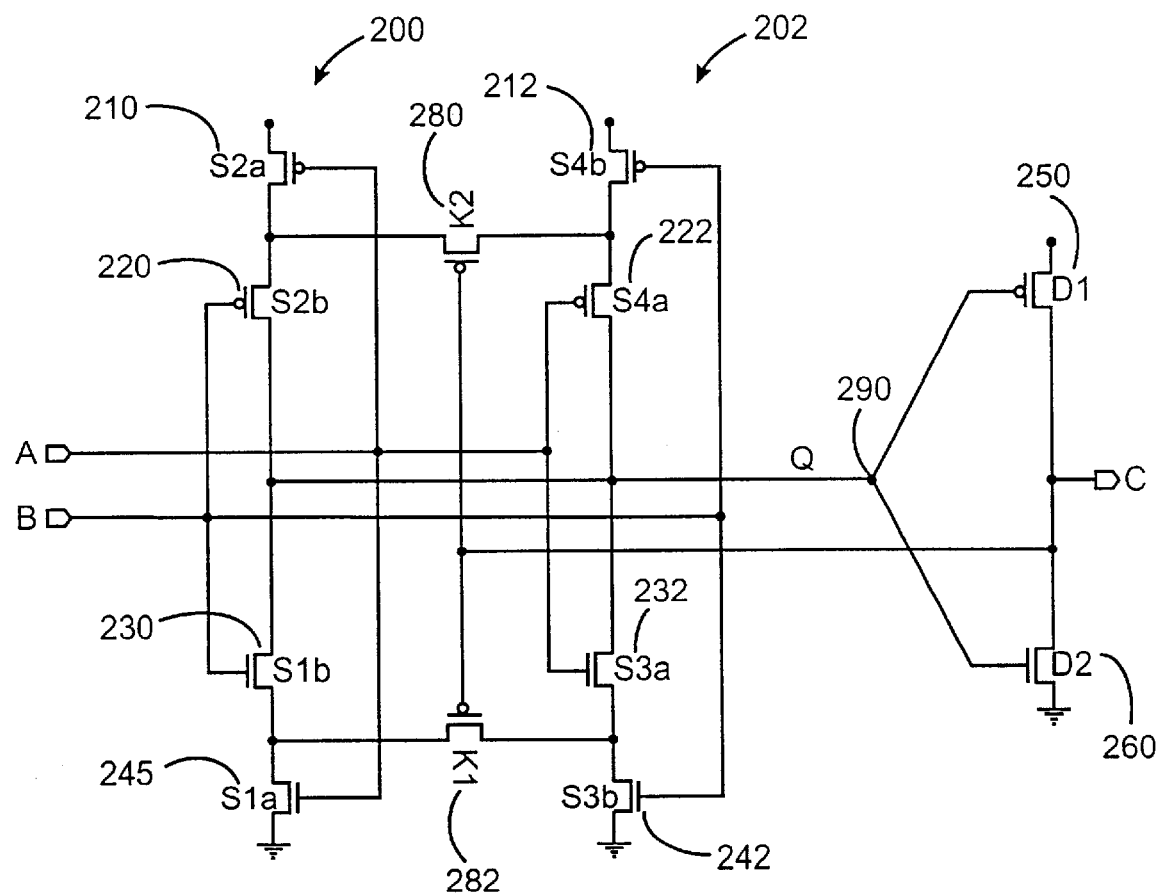
FIG. 2 is another prior art Muller C-element with two inputs.
Figure 3:
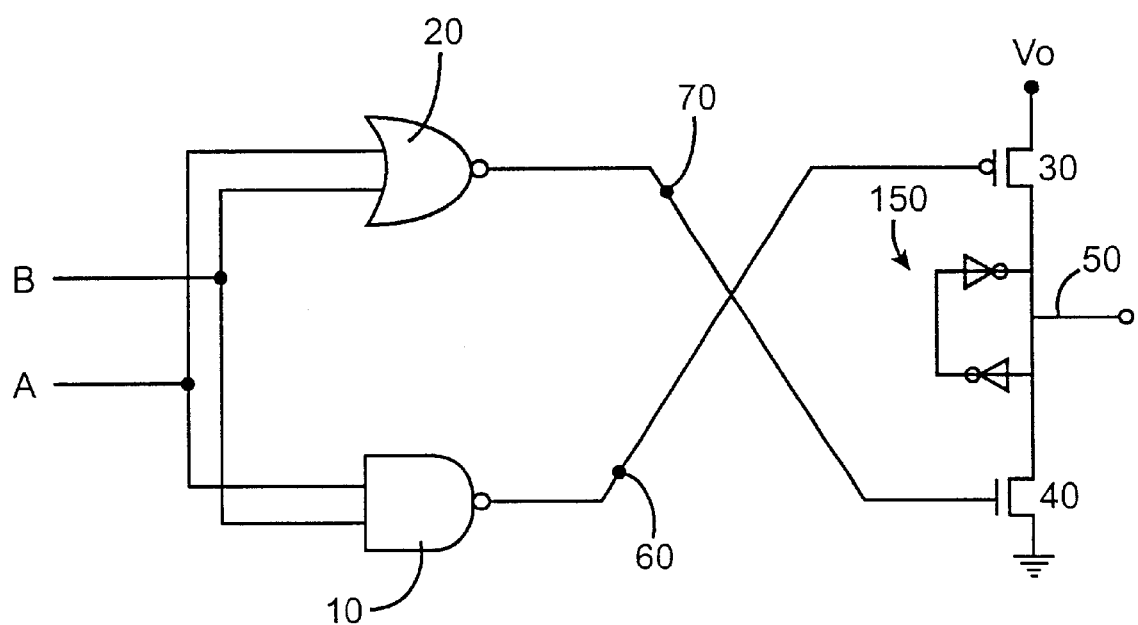
FIG. 3 is a preferred embodiment of two-input Muller C-element according to the present invention.

FIG. 3 shows a preferred embodiment of a two-input Muller C-element according to the present invention. In the first stage, inputs A and B are connected to inputs of NAND gate 10 and NOR gate 20. The NAND gate produces a first intermediate output 60, and the NOR gate produces a second intermediate output 70. In the second stage, the first intermediate output 60 is connected to the gate of a first output transistor 30, and the second intermediate output 70 is connected to the gate of a second output transistor 40. The source/drain terminals of the first output transistor are respectively connected to keeper 50 and to a power supply $V_0$. The source/drain terminals of the second output transistor are respectively connected to the keeper and to ground. For some combinations of outputs of the NAND and NOR gates, neither output transistor conducts; in these cases, the keeper acts to hold output C at its previous value. The generalization of this circuit to a case with more than two inputs is straightforward.

Figure 4:
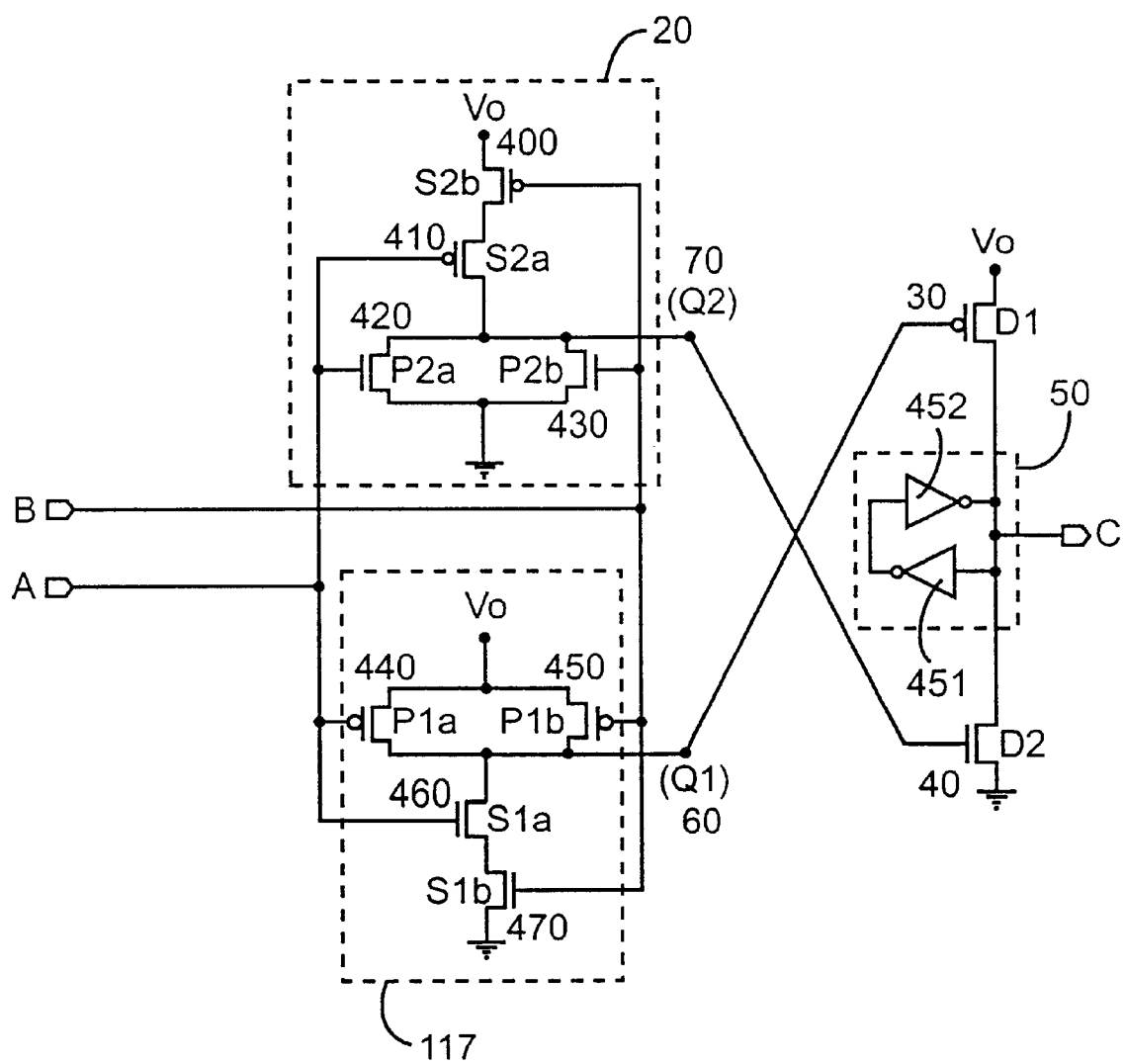
FIG. 4 is a preferred embodiment of a two-input Muller C-element according to the present invention.

FIG. 4 shows a preferred embodiment of a two-input Muller C-element according to the present invention. The NAND gate 10 comprises parallel transistors 440, 450, and series transistors 460, 470. Each of the inputs A, B is connected to the gates of one of the parallel transistors and one of the series transistors. Whenever one of the inputs is in its logical low state, the corresponding one of the parallel transistors conducts and the corresponding one of the series transistors does not conduct. This drives intermediate output line 60 to its logical high state, switching off the first output transistor 30.

The NOR gate 20 comprises series transistors 400, 410, and parallel transistors 420, 430. Each of the inputs A, B is connected to the gates of one of the series transistors and one of the parallel transistors. Whenever one of the inputs is in its logical high state, the corresponding one of the series transistors does not conduct and the corresponding one of the parallel transistors does conduct. This drives intermediate output line 70 to its logical low state, switching off the second output transistor 40.

The keeper 50 comprises two inverters 451, 452 back to back, for retaining the value of output C when neither output transistor is conducting.

The operation of the Muller C-element of FIG. 4 will now be described with reference to the timing diagrams of FIGS. 5 and 6.

Figure 5:
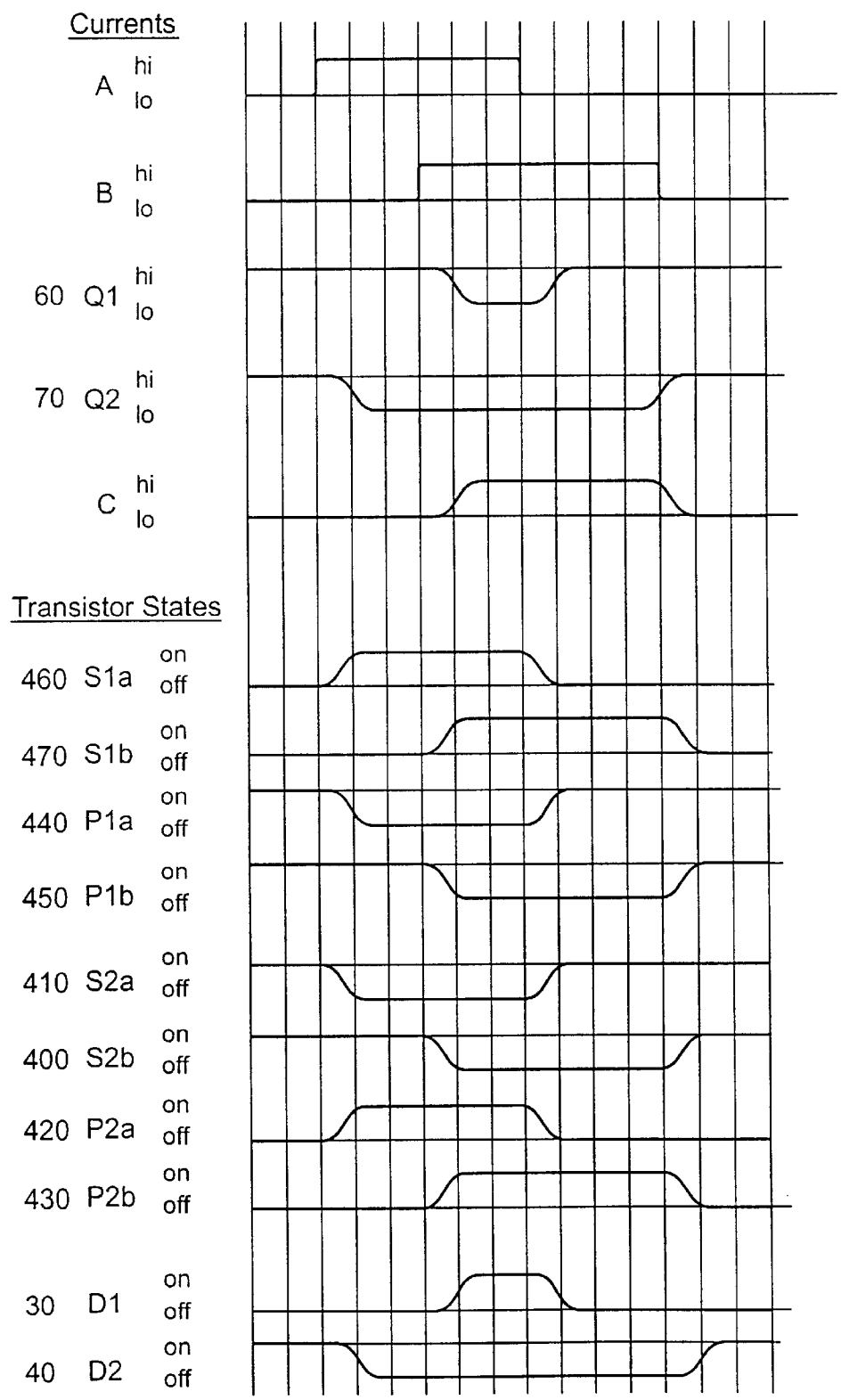
FIG. 5 is a timing diagram for the two-input Muller C-element shown in FIG. 4, for a case where the inputs change sequentially.

In FIG. 5, the inputs A and B change sequentially. Initially, both A and B are at logical low. Both parallel transistors in the NAND gate and both series transistors in the NOR gate conduct. Thus, both intermediate outputs 60 (Q1) and 70 (Q2) are at logical high. The first output transistor is off, the second output transistor is on, and output C is logical low.

When input A changes to logical high, the corresponding parallel transistor in the NAND gate 440 and series transistor in the NOR gate 410 cease to conduct, while the corresponding series transistor in the NAND gate 460 and parallel transistor in the NOR gate 420 begin to conduct. This drives the intermediate output of the NOR gate 70 (Q2) to logical low, causing the second output transistor to cease conducting. The intermediate output of the NAND gate 60 (Q1) is unaffected by the changes in its transistors, and therefore the first output transistor does not conduct. Since neither output transistor is conducting, the keeper holds output C in its logical low state. Because output C does not change, the speed with which the parallel transistor in the NOR gate acts to bring about the change in the intermediate output 70 (Q2) is not critical.

When input B subsequently changes to logical high, the corresponding parallel transistor in the NAND gate 450 and series transistor in the NOR gate 400 cease to conduct, while the corresponding series transistor in the NAND gate 470 and parallel transistor in the NOR gate 430 begin to conduct. The intermediate output of the NOR gate remains at logical low. The intermediate output of the NAND gate falls to logical low, switching on the first output transistor. This drives output C to logical high. There is no opposition from the second output transistor to this change in the output because the second output transistor was already off, and the inverters of the keeper provide only a small opposition. Thus, the speed with which C changes depends primarily on the speeds of the series transistors in the NAND gate and the first output transistor.

Figure 6:
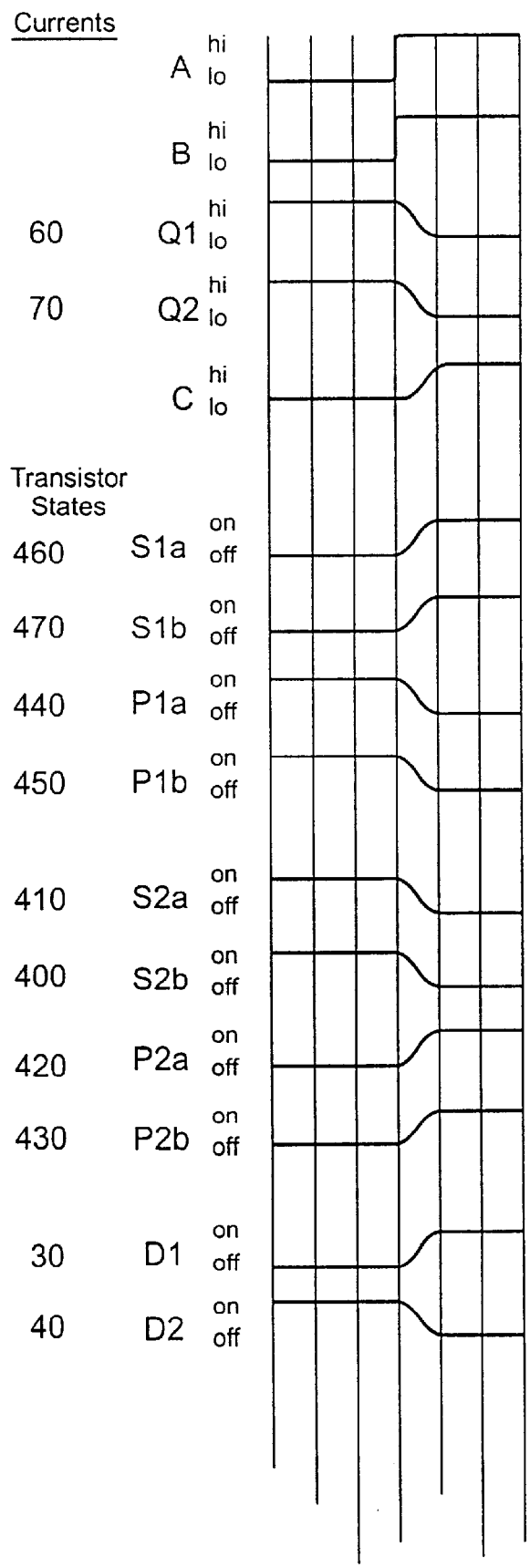
FIG. 6 is a timing diagram for the two-input Muller C-element shown in FIG. 4, for a case where the inputs change simultaneously.

In FIG. 6, the inputs change simultaneously. In the NAND gate, both parallel transistors 440, 450 cease conducting while both series transistors 460, 470 begin conducting, driving the first intermediate output 60 (Q1) to logical low and switching on the first output transistor. As this transistor turns on, it begins to drive output C to logical high. Concurrently, in the NOR gate, both series transistors 400, 410 cease conducting while both parallel transistors 420, 430 begin conducting, driving the second intermediate output 70 (Q2) to logical low and switching off the second output transistor.

In this case, if the second output transistor turns off too slowly, then the first output transistor must overcome crossover current in addition to the small opposition of the keeper. This could lead to delay or wasted energy; however, for a wide range of transistor widths, the action of the parallel transistors in the NOR gate is faster than that of the series transistors in the NAND gate, eliminating the problem of crossover current.

In a preferred embodiment, performance of the Muller C-element is optimized by selecting appropriate widths for the transistors. The selection depends on the polarity of the transistors and the ratio (g) of widths of P-type transistors to N-type transistors, which can be chosen within a range of values. In a typical embodiment, g=2. In an embodiment with positive $V_0$, like that shown in FIG. 4, the following widths are preferred.

Both series transistors in the NOR gate 400, 410 (P-type) and both series transistors in the NAND gate 460, 470 (N-type), preferably have the same width, W. Because N-type transistors of a given width are better at conducting current than P-type transistors of the same width, the series transistors in the NAND gate drive the first output transistor 30 harder than the series transistors in the NOR gate drive the second output transistor 40. However, both output transistors will drive the output line C equally if the width of the first (P-type) output transistor is g times the width of the second (N-type) output transistor. The width of the second output transistor may be chosen independently of the width W.

For optimal performance, the parallel transistors in the NOR gate 420, 430 and the parallel transistors in the NAND gate, 440, 450 must be capable of providing current equal to that of the series transistors in their respective gates. In each gate, the series transistors have an effective width of W/2. In an ordinary NAND or NOR gate, the width of each of the parallel transistors would have to be matched to this; however, as discussed above, the speed of the NAND and NOR gates is critical only when the inputs change simultaneously. In that case, the parallel transistors act together and hence it is their combined width that must be matched to the series transistors. Thus, each of the (P-type) parallel transistors in the NAND gate preferably has a width of W/4, and each of the (N-type) parallel transistors in the NOR gate preferably has a width of W/4g. Transistors of a narrower width are preferred because they make the inputs easier to drive and provide faster performance.

Figure 7:
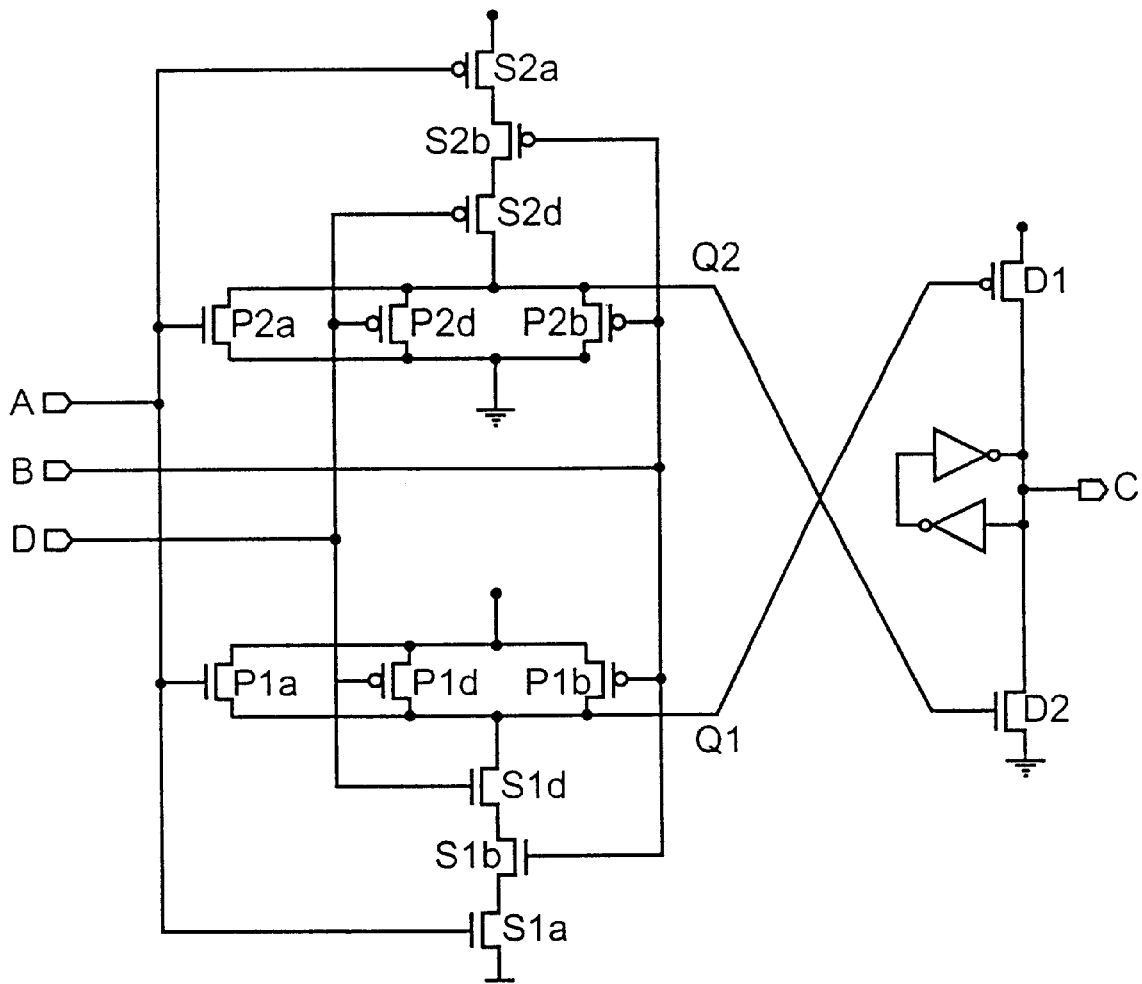
FIG. 7 is an embodiment of a three-input Muller C-element according to the present invention.

FIG. 7 shows a preferred embodiment of a three-input Muller C-element according to the present invention. One skilled in the art can easily generalize to Muller C-elements with a larger number of inputs.

The invention has now been described with reference to the preferred embodiment. Alternatives and substitutions will now be apparent to persons of skill in the art. For example, the polarity of the circuit may be reversed, with appropriate substitutions in transistor polarity and width. Accordingly it is not intended to limit the invention except as provided by the following claims.

What is claimed is:

1. A two-stage Muller C-element having a pair of input lines and one output line, said two-stage Muller C-element comprising:

a first stage comprising:
 a first intermediate output line;
 a second intermediate output line;
 a NAND gate having a pair of input lines inputs and one output, wherein each of said pair of input lines is connected to one of said pair of inputs of said NAND gate, and wherein said output of said NAND gate is connected to said first intermediate output line with the NAND gate including first and second input line n-channel transistors in series, wherein a gate terminal of each of said n-channel transistors in series is connected to a different one of said inputs to said NAND gate, a first source/drain terminal of the first n-channel transistor in series is connected to said first intermediate output line, and a second source/drain terminal of the second n-channel transistor in series is connected to ground; and first and second input line p-channel transistors in parallel, wherein a gate terminal of each of said p-channel transistors in parallel is connected to a different one of said inputs to said NAND gate, a first source/drain terminal of each of said p-channel transistors in parallel is connected to a power supply, and a second source/drain terminal of each of said p-channel transistors in parallel is connected to said first intermediate output line;

a NOR gate having a pair of input lines inputs and one output, wherein each of said pair of input lines is connected to one of said inputs of said NOR gate, and wherein said output of said NOR gate is connected to said second intermediate output line with the NOR gate including first and second input line p-channel transistors in series, wherein a gate terminal of each of said p-channel transistors in series is connected to a different one of said inputs to said NOR gate, a first source/drain terminal of the first p-channel transistor in series is connected to a power supply, and a second source/drain terminal of the second p-channel transistor in series is connected to said second intermediate output line; and a pair of input line n-channel transistors in parallel, wherein a gate terminal of each of said n-channel transistors in parallel is connected to a different one of said inputs to said NOR gate, a first source/drain terminal of each of said n-channel transistors in parallel is connected to ground, and a second source/drain terminal of each of said n-channel transistors in parallel is connected to said second intermediate output line;

where the widths of the transistors are chosen such that:

each of said n-channel transistors in series in the NAND gate and each of said p-channel transistors in series in the NOR gate has substantially the same width;

each of said p-channel transistors in parallel in the NAND gate has a width equal to about one fourth of the product of said width of any one of said n-channel transistors in series in the NAND gate times a chosen ratio of widths of p-type to n-type transistors;

and each of said n-channel transistors in parallel in the NOR gate has a width equal to about one fourth of the quotient of said width of any one of said p-channel transistors in series in the NOR gate divided by said chosen ratio of widths of p-type to n-type transistors a second stage comprising:

a first output transistor having a gate connected to said first intermediate output line, a first source/drain terminal connected to a power supply, and a second source/drain terminal connected to said output line;

a second output transistor having a gate connected to said second intermediate output line, a first source/drain terminal connected to said output line, and a second source/drain terminal connected to ground; and a keeper connected to said output line and retaining the value of said output line when neither of said first or second output transistors conducts.

2. The Muller C-element of claim 1, wherein widths of said first and second output transistors are chosen so that the ratio of the width of said first output transistor to the width of said second output transistor is equal to said chosen ratio of widths of p-type to n-type transistors.

3. The two-stage Muller C-element of claim 1, wherein said keeper comprises two inverters in series, the input of a first of said two inverters and the output of a second of said two inverters being connected to said output line.

* * * * *